United States Patent
Borse

(10) Patent No.: US 11,973,466 B2
(45) Date of Patent: Apr. 30, 2024

(54) OSCICLAMP—AN ELECTRONIC CIRCUIT TO INCREASE LOW VOLTAGE LEVELS OF ELECTRICAL SOURCES

(71) Applicant: Swaresh Borse, Allen, TX (US)

(72) Inventor: Swaresh Borse, Allen, TX (US)

(73) Assignee: Swaresh Borse, Allen, TX (US)

( * ) Notice: Subject to any disclaimer, the term of this patent is extended or adjusted under 35 U.S.C. 154(b) by 0 days.

(21) Appl. No.: 17/746,142

(22) Filed: May 17, 2022

(65) Prior Publication Data

US 2022/0376656 A1     Nov. 24, 2022

Related U.S. Application Data

(60) Provisional application No. 63/191,124, filed on May 20, 2021.

(51) Int. Cl.
    *H03B 5/12*       (2006.01)
    *H03B 5/06*       (2006.01)

(52) U.S. Cl.
    CPC ............. *H03B 5/1243* (2013.01); *H03B 5/06* (2013.01); *H03B 5/1221* (2013.01); *H03B 5/1231* (2013.01)

(58) Field of Classification Search
    CPC ...... H03B 5/1243; H03B 5/06; H03B 5/1221; H03B 5/1231
    USPC ............................... 331/158, 74, 116 FE, 143
    See application file for complete search history.

(56) References Cited

U.S. PATENT DOCUMENTS 4,956,618 A * 9/1990 Ulmer ...................... H03B 5/06
                                                                                                  331/158
11,075,602 B1 * 7/2021 Balmelli ................ H03K 3/011

FOREIGN PATENT DOCUMENTS

WO     WO-2021261501 A1 * 12/2021

OTHER PUBLICATIONS https://www.tdpri.com/threads/555-voltage-multiplier-question.835937/DEANE 555 Voltage Multiplier Question (Year: 2018).*
https://www.researchgate.net/figure/Schematic-representation-of-the-different-MOS-field-effect-devices-a-capacitor-b_fig_17_251183606 Hierlemann et al Dec. 2006 (Year: 2006).*
DC Voltage Converter Circuits Jan. 1998(Nuts and Volts magazine, Jan. 1998) DC voltage converter operating principles—Plus a selection of practical application circuits. (Year: 1998).*

* cited by examiner

*Primary Examiner* — Arnold M Kinkead

(57) ABSTRACT

The present invention is an electronic circuit used to increase voltage levels of electrical signals from sources having low voltage levels for any required application in an electrical system. While the focus is to increase voltage levels, current levels can also be optimized per application requirements. It is built by electronically cascading a clamper circuit or a part of clamper circuit to an oscillator circuit. The oscillator circuit generates an AC signal. The basic functionality of a clamper circuit is to raise DC level of an AC signal. With an oscillator circuit feeding an AC signal to the clamper circuit, multiple applications can be achieved economically. Said invention can be used for driving LEDs at low voltage levels, charge a capacitors to higher voltage levels than a voltage applied to it, low frequency signal amplifiers, low frequency signal generators, AM/FM modulators, etc.

10 Claims, 5 Drawing Sheets

OSCICLAMP—AN ELECTRONIC CIRCUIT TO INCREASE LOW VOLTAGE LEVELS OF ELECTRICAL SOURCES

CROSS REFERENCE TO RELATED APPLICATIONS

This application claims priority of and incorporates by reference U.S. provisional patent application No. 63/191,124, filed on May 20, 2021.

BACKGROUND OF THE INVENTION

1. Field of Invention

The present invention relates to electrical and electronic systems wherein applications with higher level of operating voltage requirements can be fulfilled with low voltage level sources. Said sources can be AC or DC.

2. Description of Related Art

A Light-Emitting-Diode (LED) is a semi-conductor device that has a certain forward voltage drop that needs to be overcome by an electrical source before it can glow. Proper operation of LED requires a supply voltage of 3V-5V. Said invention can make a LED emit light at lower supplied voltages which can be in the range of 1 to 1.5V. Said invention can be used to charge capacitors and re-chargeable batteries to voltages higher than the source or supplied voltage.

Existing DC-DC boost converters are complicated and expensive to implement. Said invention is more economic and simpler. Low frequency AC signals can be amplified by using said invention with use of a small DC biasing voltage and no additional biasing components. Existing applications that use conventional amplifiers require high level DC biasing voltage along with some additional components.

SUMMARY OF THE INVENTION

The present invention boosts low voltage level of a supplied signal to a high voltage level. However, said invention may not retain the frequency of said supplied signal. Whether it retains signal frequency or not, depends on values of the electronic components used. It uses a combination of transistors, diodes, capacitors, and inductors. Said transistor is used as an oscillator. Said inductors, capacitors and diodes are connected to form a clamper circuit, components of which store and release electric energy in alternating cycles of said multi-vibrator. This raises voltage level of a supplied source signal.

The present invention works by creating a new GND terminal in an electrical application circuit. The input and output terminals of said application circuit remain common.

Main applications of said invention are to drive LEDs and charge capacitors in a circuit to high voltage levels using a low voltage source. Plurality of said inventions can be used in cascade with each other to achieve much higher output voltage levels than supplied input voltage levels.

BRIEF DESCRIPTION OF INVENTION DRAWINGS

Figure 1:
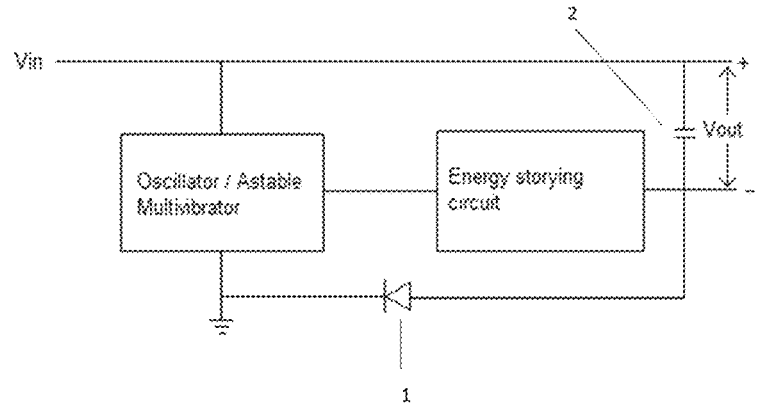
Figure 2:
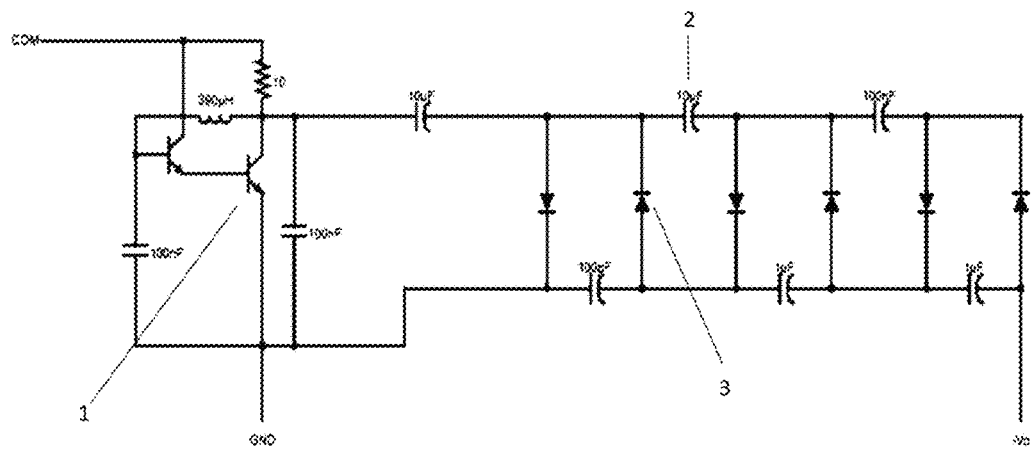
Figure 3:
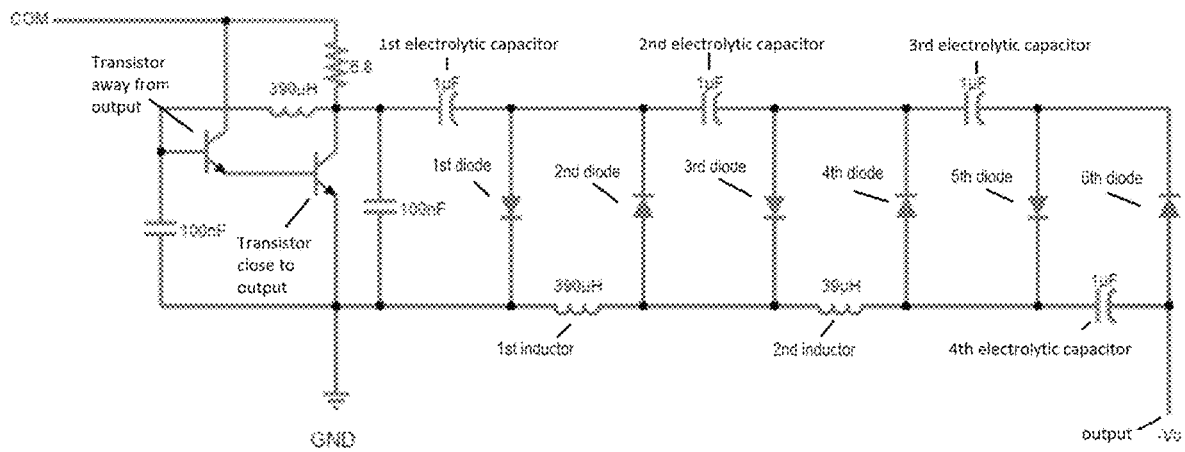
Figure 4:
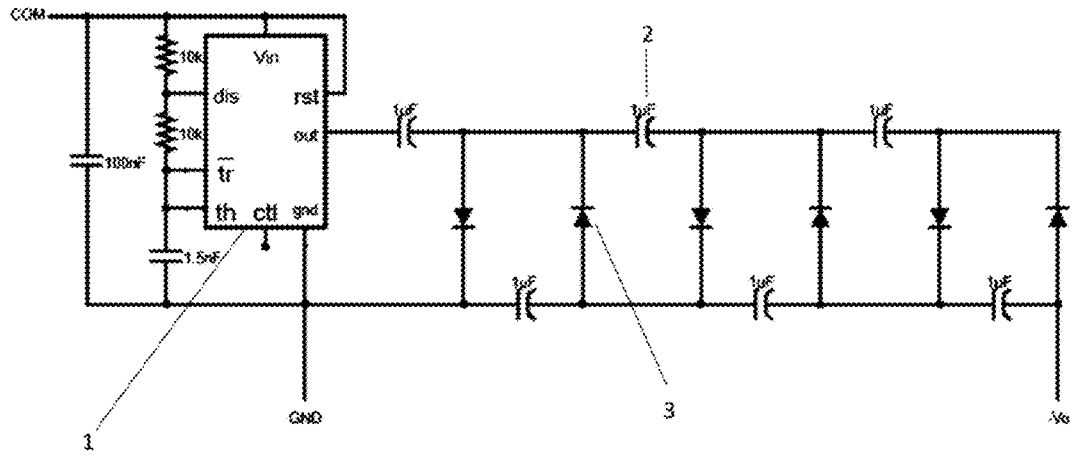
Figure 5:
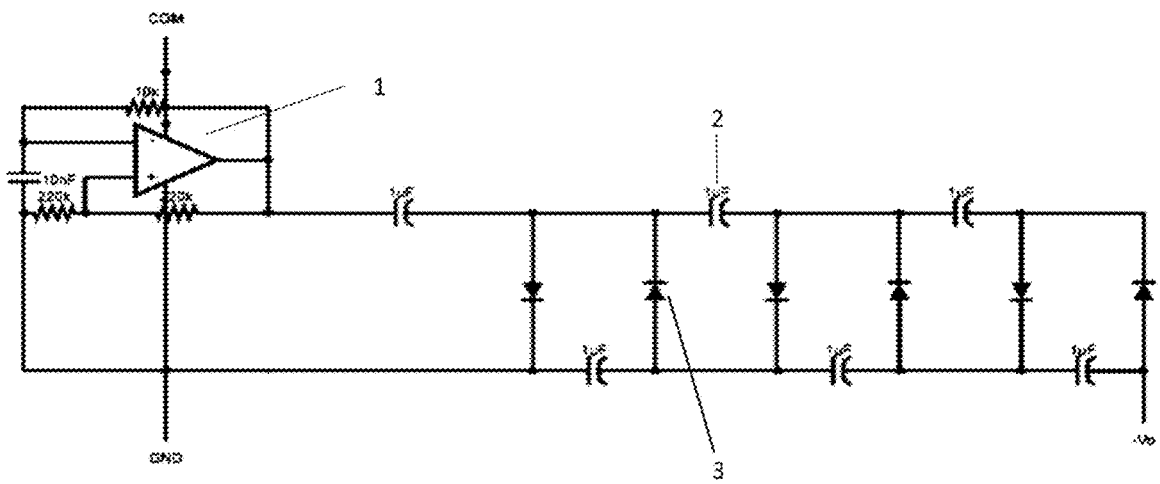
Figure 6:
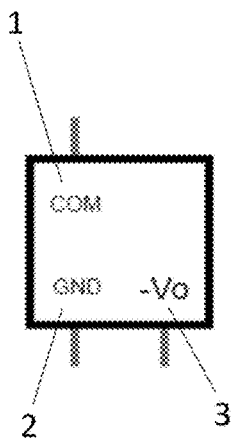
Figure 7:
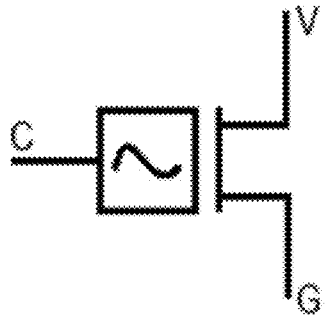
Figure 8:
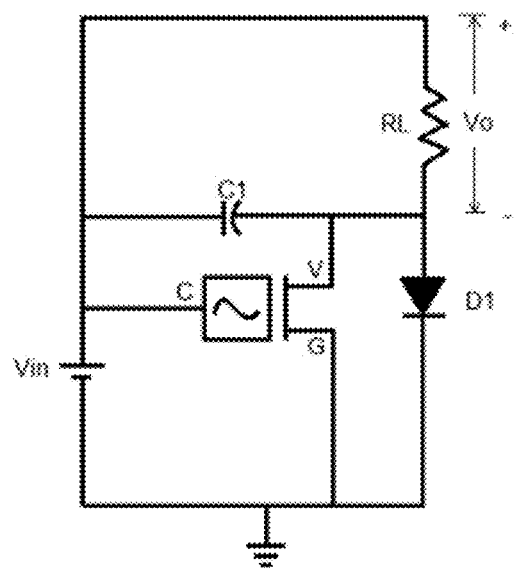
Figure 9:
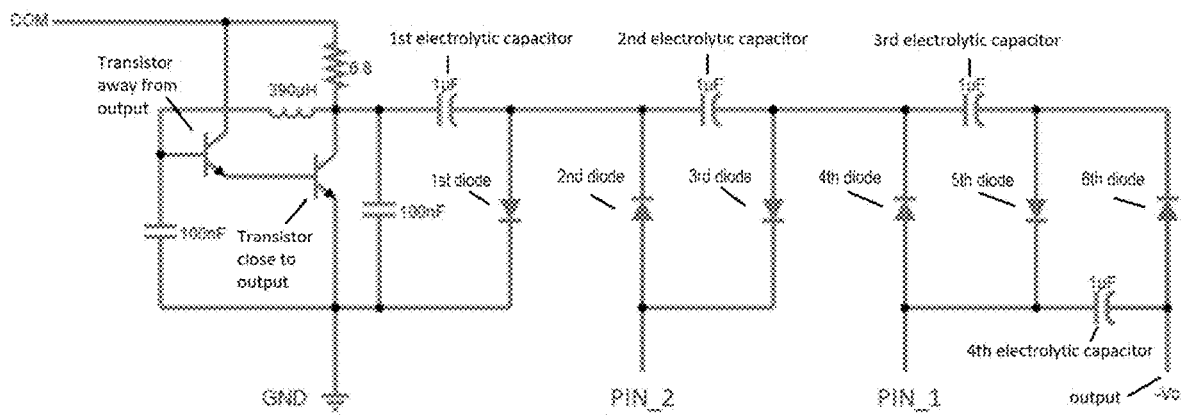
Figure 10:
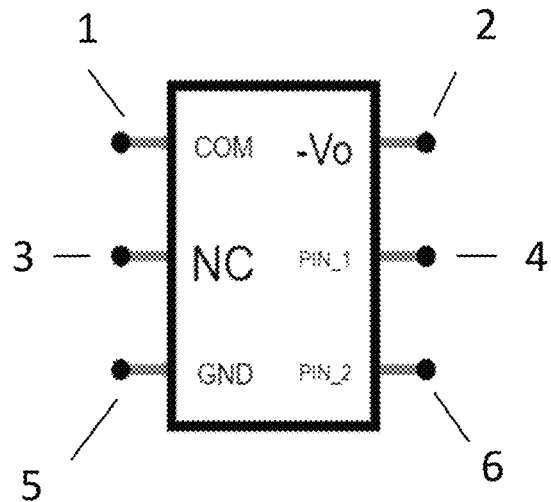
Figure 11:
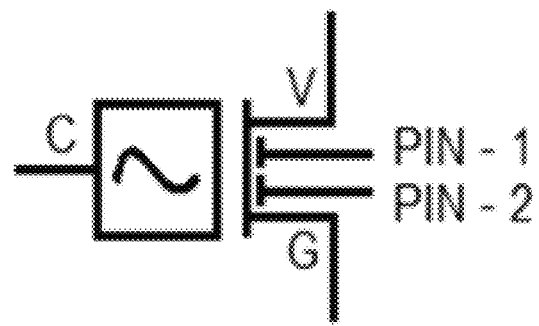
Figure 12:
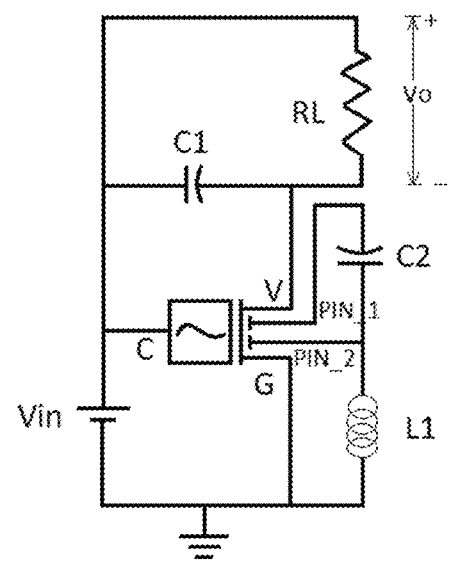
Figure 13:
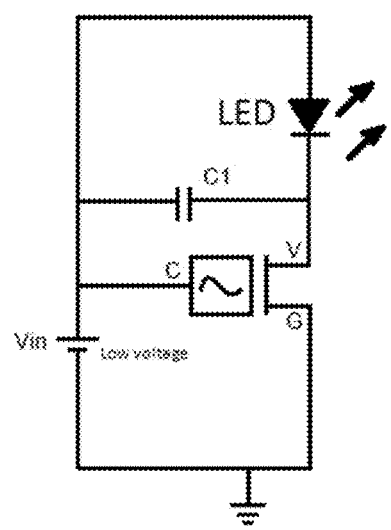

FIG. 1. Generic block diagram of said invention.
FIG. 2. Circuit diagram of said invention using transistors to build an oscillator coupled with a clamper circuit.
FIG. 3. Circuit diagram of said invention using transistors to build an oscillator and a combination of inductors in series and capacitors for clamping.
FIG. 4. Circuit diagram of said invention using IC 555 in an a stable multivibrator mode coupled with a clamper circuit.
FIG. 5. Circuit diagram of said invention using OPAMP to build an oscillator coupled with a clamper circuit.
FIG. 6. Integrated circuit of said invention.
FIG. 7. Circuit symbol of said invention.
FIG. 8. Circuit diagram with circuit symbol of application of said invention.
FIG. 9. Circuit diagram of said invention using transistors to build an oscillator coupled with a clamper circuit with some open segments.
FIG. 10. Integrated circuit of said invention with partial clamper circuit.
FIG. 11. Circuit symbol of said invention with partial clamper circuit.
FIG. 12. Circuit diagram with circuit symbol of application of said invention with partial clamper circuit.
FIG. 13. Circuit diagram of application of said invention with LED as electrical load.

DETAILED DESCRIPTION OF INVENTION

The present invention uses a combination of transistors, Schottky diodes, capacitors, and inductors to boost voltage of an electrical signal. Said signal can be from an AC or DC source.

Said transistors are used in pair to form an oscillator circuit. An oscillator built with a switching transistor 2N2222 or with integrated circuit LMC555 can operate on voltage levels as low as 1V. When cascaded with an oscillator circuit, a clamper circuit shifts AC signal (generated by said oscillator) to a higher value voltage level. The value by which voltage level increases, depends on the number of electrical energy storing components—capacitors and inductors used in said clamper circuit.

A clamper circuit is a network of diodes and capacitors electrically connected such as to achieve a DC voltage level shifting. Said invention makes use of Schottky diodes and electrolytic capacitors. Germanium diodes can also be used instead of Schottky diodes. Both types of diodes have low forward voltage drop compared to other diodes which help in better conservation of electrical energy. Some capacitors in said clamper circuit can be replaced by inductors to improve current response of the circuit. This modification of said clamper circuit is aimed at optimizing the output voltage and current per application requirements.

Present invention defines voltage gain which is determined by the ratio of output voltage level to input or source voltage level. FIG. 3 in invention drawings, illustrates circuit diagram of said invention with two transistors, six diodes (labeled first through sixth), three inductors and six capacitors. Three capacitors (labeled first through three) are connected in series with each other. One of the inductors is used as a feedback component for said oscillator circuit. The other two inductors (labeled first and second) are connected in series with a fourth capacitor. The approximate gain of this circuit is 2. This means, if a 1.5V DC battery is connected as input, the output voltage will be 3V.

A 3-pin integrated circuit component can be manufactured as shown in FIG. 6 of invention drawings. The source and/or biasing (if any, depending on the application) connects across the common and ground terminals and the load connects across the common and the output terminals of the component.

Another circuit of said invention, as shown in FIG. 9 of invention drawings. There are two transistors, six diodes (labeled first through sixth), one inductor and six capacitors. Three capacitors (labeled first through three) are connected in series with each other. Said one inductor is used as a feedback component for said oscillator circuit. Circuit diagram shown in FIG. 9 of invention drawings is similar to circuit diagram shown in FIG. 3 of invention drawings except some segments in said clamper circuit are left open. The first and second inductor from FIG. 3 of invention drawings is not present in said circuit shown in FIG. 9 of invention drawings. This enables users to decide between connecting capacitors or inductors in those open spots of the circuit. This helps users to optimize the output voltage and current requirements of a load in any given application. Providing this flexibility to the users by opening some terminals in the clamper circuit, a 6-pin integrated circuit can be designed as shown in the FIG. 10 of invention drawings. Just like the 3-pin integrated circuit, this component allows connection of source or biasing (if any, depending on the application) between the common and ground terminal. The load connects between the common and output terminal. Besides this, two additional terminals are defined for the 6-pin integrated circuit—Pin_1 and Pin_2. Capacitors and/or inductors can be connected between said output terminal, Pin 1, Pin_2 and ground terminals. An application circuit example of 6-pin circuit symbol representation is shown in FIG. 12 of invention drawings.

The invention claimed is:

1. A circuit comprising:
an oscillator circuit with two bi-polar junction transistors of type NPN, one is close to input side of circuit and other is close to output side of said circuit, wherein emitter pin of said transistor on input side of said circuit is connected to base pin of said second transistor on output side of said circuit, one resistor is connected between collector pins of said transistors, one 390 micro-henry inductor is connected between the base pin of transistors on input side of said circuit and collector pin of said transistors on output side of said circuit, one 0.1 micro-farad capacitor is connected between emitter and collector pins of said transistor on output side of said circuit, second 0.1 micro-farad capacitor is connected between ground pin of said invention and base pin of said transistor on input side of said circuit; and
a clamper circuit wherein positive pin of an electrolytic capacitor is connected to collector pin of said transistor which is close to said output of said invention and negative pin of said electrolytic capacitor is connected to anode pin of a diode first one from input side of said circuit, cathode pin of a second diode and positive pin of a second electrolytic capacitor, an inductor is connected between cathode pin of said first diode and anode pin of said second diode, cathode pin of said first diode is connected to ground pin of said invention, negative pin of said second electrolytic capacitor is connected to anode pin of a third diode, cathode pin of a fourth diode and positive pin of a third electrolytic capacitor, an inductor is connected between cathode pin of said third diode and anode pin of said fourth diode, negative pin of said third electrolytic capacitor is connected to anode pin of a fifth diode and cathode pin of a sixth diode, positive pin of a fourth electrolytic capacitor is connected to cathode pin of said fifth diode and negative pin of said fourth electrolytic capacitor is connected to anode pin of said sixth diode.

2. The circuit as in claim 1, wherein both said transistors have part number values 2N2222.

3. The circuit as in claim 1, wherein both said transistors have part number values BC547.

4. The circuit as in claim 1, wherein said diodes in said clamper circuit are of type Schottky.

5. The circuit as in claim 1, wherein said diodes in said clamper circuit are of type germanium.

6. A circuit comprising:
an oscillator circuit with two bi-polar junction transistors of type NPN one is close to input side of said circuit and other is close to output side of said circuit, wherein emitter pin of said transistor on input side of said circuit is connected to base pin of said second transistor on output side of said circuit, one resistor is connected between collector pins of said transistors, one 390 micro-henry inductor is connected between the base pin of said transistors on input side of said circuit and collector pin of the second transistors on output side of said circuit, one 0.1 micro-farad capacitor is connected between emitter and collector pins of said transistor on output side of said circuit, second 0.1 micro-farad capacitor is connected between ground pin of said invention and base pin of said transistor on input side of said circuit; and
a clamper circuit wherein positive pin of an electrolytic capacitor is connected to collector pin of said transistor which is close to said output of said invention and negative pin of said electrolytic capacitor is connected to anode pin of a diode first one from input side of said circuit, cathode pin of a second diode and positive pin of a second electrolytic capacitor, cathode pin of said first diode is connected to ground pin of said invention, negative pin of said second electrolytic capacitor is connected to anode pin of a third diode, cathode pin of a fourth diode and positive pin of a third electrolytic capacitor, negative pin of said third electrolytic capacitor is connected to anode pin of a fifth diode and cathode pin of a sixth diode, positive pin of a fourth electrolytic capacitor is connected to cathode pin of said fifth diode and negative pin of said fourth electrolytic capacitor is connected to anode pin of said sixth diode.

7. The circuit as in claim 6, wherein said diodes in said clamper circuit are of type Schottky.

8. The circuit as in claim 6, wherein said diodes in said clamper circuit are of type germanium.

9. The circuit as in claim 6, wherein both said transistors have part number values 2N2222.

10. The circuit as in claim 6, wherein both said transistors have part number values BC547.

* * * * *